(12) United States Patent
Yin et al.

(10) Patent No.: US 12,025,301 B2
(45) Date of Patent: Jul. 2, 2024

(54) POWER SUPPLY SYSTEM

(71) Applicant: Aputure Imaging Industries Co., Ltd., Guangdong (CN)

(72) Inventors: Zhouzhou Yin, Guangdong (CN); Kun Tong, Guangdong (CN); Xiangjun Zhou, Guangdong (CN); Yi Xie, Guangdong (CN)

(73) Assignee: Aputure Imaging Industries Co., Ltd., Shenzhen (CN)

( * ) Notice: Subject to any disclaimer, the term of this patent is extended or adjusted under 35 U.S.C. 154(b) by 74 days.

(21) Appl. No.: 17/865,619

(22) Filed: Jul. 15, 2022

(65) Prior Publication Data

US 2023/0184420 A1 Jun. 15, 2023

(30) Foreign Application Priority Data

Dec. 10, 2021 (CN) .......................... 202123109079.6

(51) Int. Cl.
*F21V 23/02* (2006.01)
*F21W 131/406* (2006.01)
*G01R 33/00* (2006.01)
*G01R 33/07* (2006.01)
*H01R 13/627* (2006.01)
*H02M 3/155* (2006.01)
*H05K 5/02* (2006.01)

(52) U.S. Cl.
CPC ........ *F21V 23/023* (2013.01); *G01R 33/0058* (2013.01); *G01R 33/0088* (2013.01); *G01R 33/07* (2013.01); *H01R 13/6271* (2013.01); *H02M 3/155* (2013.01); *H05K 5/0217* (2013.01); *F21W 2131/406* (2013.01)

(58) Field of Classification Search
CPC ... F21V 23/023; G01R 33/0058; G01R 33/07; H01R 13/6271; H02M 3/155; F21W 2131/406
See application file for complete search history.

(56) References Cited

U.S. PATENT DOCUMENTS

| 9,581,304 B2* | 2/2017 | Carlén | F21V 23/023 |
| 2016/0266214 A1* | 9/2016 | Nomura | H02J 7/0042 |
| 2017/0237206 A1* | 8/2017 | Byrne | H01R 13/6675 |
| | | | 307/125 |

* cited by examiner

*Primary Examiner* — Jared Fureman
*Assistant Examiner* — Duc M Pham
(74) *Attorney, Agent, or Firm* — Brooks Kushman P. C.; John E. Nemazi

(57) ABSTRACT

This application provides a power supply system. The power supply system includes a first device and a second device. The first device may be one of a control device and a film-and-television light, and the second device may be the other of the control device and the film-and-television light. The first device includes a first housing, a first coupler socket, a power supply circuit and a first set of contacts. The second device includes a second housing, a second coupler socket, a power receiving circuit, and a second set of contacts. In the power supply system. The power supply circuit in the first device and the power receiving circuit in the second device can be electrically connected through the first set of contacts in stalled on the first coupler socket and the second set of contacts installed on the second coupler socket.

19 Claims, 6 Drawing Sheets

POWER SUPPLY SYSTEM

CROSS-REFERENCE TO THE RELATED APPLICATION

Pursuant to 35 U.S.C. § 119 and the Paris Convention, this application claims the benefit of Chinese Patent Application No. 202123109079.6 filed Dec. 10, 2021, the content of which is incorporated herein by reference.

FIELD

The present application relates to the field of circuit technology, and more particularly, to a power supply system.

BACKGROUND

Film-and-television lights are lamps used for lighting or used to achieve a certain light effect in stage performances or film and television shooting. Generally, in the use of film-and-television light, in addition to the film-and-television light, a control device is also included. The control device can be connected to the film-and-television light through a cable, so as to obtain power from the film-and-television light, or supply power to the film-and-television light by the control device.

In the related technologies, the cable connected between the control device and the film-and-television light has a length of at least three meters. In this circumstance, when a large number of film-and-television lights and control devices are existed, connections between the control devices and the film-and-television lights will be very cumbersome. Thus, the connection manner between the film-and-television lights and the control device is in urgent need of improvement.

SUMMARY

The present application provides a power supply system, which solves the problem of complicated connection between a control device and a film-and-television light in the related technologies. Embodiments of the present application may be implemented as follows:

In accordance with a first aspect of this disclosure, a power supply system is provided, which includes a first device and a second device.

The first device includes a first housing, a first coupler socket, a power supply circuit and a first set of contacts. The first coupler socket is located on an outer surface of the first housing. The power supply circuit is located in an inner cavity of the first housing. An input end of the power supply circuit is configured to be electrically connected to the first voltage terminal V1. The first set of contacts is installed on the first coupler socket, penetrates through the first housing and is electrically connected to an output end of the power supply circuit.

The second device includes a second housing, a second coupler socket, a power receiving circuit and a second set of contacts. The second coupler socket is located on the outer surface of the second housing. The power receiving circuit is located in an inner cavity of the second housing. The second set of contacts is installed on the second coupler socket, penetrates the second housing and is electrically connected to an input end of the power receiving circuit.

The second coupler socket is configured to form a snap connection with the first coupler socket. The second set of contacts is in electrical connection with the first set of contacts when the snap connection is formed between the second coupler socket and the first coupler socket.

In the present application, the power supply system includes a first device and a second device. The first device may be one of a control device and a film-and-television light, and the second device may be the other of the control device and the film-and-television light. The first device includes a first housing, a first coupler socket located on a surface of the first housing, a power supply circuit located in the first housing, and a first set of contacts. The first set of contacts is installed on the first coupler socket, penetrates through the first housing, and is electrically connected to the output end of the power supply circuit. The second device includes a second housing, a second coupler socket located on a surface of the second housing, a power receiving circuit located in the second housing, and a second set of contacts. The second set of contacts is installed on the second coupler socket, penetrates through the second housing and is electrically connected to the input end of the power receiving circuit. The electrical connection between the first device and the second device can be formed when the second coupler socket and the first coupler socket are snap-connected. At this time, the second set of contacts is in contact with the first set of contacts and is electrically connected, so that the output end of the power supply circuit is electrically connected to the input end of the power receiving circuit. In the power supply system, the first device and the second device can be snap-connected through the first coupler socket and the second coupler socket, and the power supply circuit in the first device and the power receiving circuit in the second device can be electrically connected through the first set of contacts in stalled on the first coupler socket and the second set of contacts installed on the second coupler socket. Thus, the stability of electrical signal transmission between devices can be improved.

Optionally, the second device includes a field component for generating a physical field, and the field component is connected to the second housing.

The first device also includes a physical field sensor, and the physical field sensor is connected to the first housing. The physical field sensor is configured to sense the physical field generated by the field component, and to output an on-signal by the physical field sensor, under an action of the physical field generated by the field component when the second coupler socket is snap connected to the first coupler socket.

A control end of the power supply circuit is electrically connected to an output end of the physical field sensor, to enable a conduction between the input end and the output end of the power supply circuit when the on-signal is output from the physical field sensor.

Optionally, the field component includes a magnet and the physical field sensor includes a Hall sensor or a reed switch.

Optionally, the Hall sensor includes a Hall sensor chip U1, a resistor R1, a resistor R2 and a capacitor C1.

A power-supply pin of the Hall sensor chip U1 is configured to be electrically connected to a second voltage terminal V2, a ground pin of the Hall sensor chip U1 is configured to be electrically connected to a ground wire GND, and a voltage from the second voltage terminal V2 is greater than a voltage of the ground wire GND.

A first end of the resistor R1 is electrically connected to an output end of the Hall sensor chip U1, and a second end of the resistor R1 is electrically connected to a first end of the resistor R2 and the control end of the power supply circuit.

A second end of the resistor R2 is configured to be electrically connected to the ground wire GND.

A first electrode plate of the capacitor C1 is electrically connected to a second end of the resistor R1, and a second electrode plate of the capacitor C1 is configured to be electrically connected to the ground wire GND.

Optionally, the reed switch includes a resistor R3 and a magnetic sensitive switch K1.

A first end of the resistor R3 is configured to be electrically connected to a third voltage terminal V3, and a second end of the resistor R3 is electrically connected to a first end of the magnetic sensitive switch K1 and the control end of the power supply circuit.

A second end of the magnetic sensitive switch K1 is configured to be electrically connected to the ground wire GND, and a voltage of the third voltage terminal V3 is greater than the voltage of the ground wire GND.

Optionally, the field component includes an energized conductor, and the physical field sensor includes an electric field sensor.

Optionally, the power supply circuit includes a transistor M1 and a transistor M2.

A control electrode of the transistor M1 is electrically connected to the output end of the physical field sensor, a first electrode of the transistor M1 is electrically connected to a control electrode of the transistor M2, and a second electrode of the transistor M1 is electrically connected to the ground wire GND.

A first electrode of the transistor M2 is configured to be electrically connected to the first voltage terminal V1, and a second electrode of the transistor M2 is electrically connected to the first set of contacts.

Optionally, the power receiving circuit includes a resistor R4, a diode D1 and a Zener diode D2.

A first end of the resistor R4 is electrically connected to the second set of contacts, and a second end of the resistor R4 is electrically connected to an anode of the diode D1.

A cathode of the diode D1 is configured to output electrical energy.

An anode of the Zener diode D2 is electrically connected to the ground wire GND, and a cathode of the Zener diode D2 is electrically connected to the cathode of the diode D1.

Optionally, the first device also includes a controller MCU1, a first communication circuit and a third set of contacts. The controller MCU1 and the first communication circuit are located in the inner cavity of the first housing. A first end of the first communication circuit is electrically connected to the controller MCU1. The third set of contacts is installed on the first coupler socket, penetrates through the first housing, and is electrically connected to a second end the first communication circuit.

The second device also includes a controller MCU2, a second communication circuit and a fourth set of contacts. The controller MCU2 and the second communication circuit are located in the inner cavity of the second housing. A first end of the second communication circuit is electrically connected to the controller MCU2. The fourth set of contacts is installed on the second coupler socket, penetrates through the second housing, and is electrically connected to a second end of the second communication circuit.

The fourth set of contacts is in electrical connection with the third set of contacts when the second coupler socket and the first coupler socket are snap-connected.

Optionally, the first communication circuit includes a communication chip U2. A first pin J11 of the communication chip U2 is electrically connected to a communication output end RO of the controller MCU1. A second pin J12 of the communication chip U2 is electrically connected to a communication control end CT1 of the controller MCU1. A third pin J13 of the communication chip U2 is electrically connected to a communication input end DI of the controller MCU1. A fourth pin J14 of the communication chip U2 is electrically connected to a contact J1 in the third set of contacts. A fifth pin J15 of the communication chip U2 is electrically connected to a contact J2 of the third set of contacts.

The second communication circuit includes a communication chip U3. A first pin J21 of the communication chip U3 is electrically connected to a communication output end RXD of the controller MCU2. A second pin J22 of the communication chip U3 is electrically connected to a communication control end CT2 of the controller MCU2. A third pin J23 of the communication chip U3 is electrically connected to a communication input end TXD of the controller MCU2. A fourth pin J24 of the communication chip U3 is electrically connected to a contact J3 in the fourth set of contacts. A fifth pin J25 of the communication chip U3 is electrically connected to a contact J4 in the fourth set of contacts The contact J3 is in electrical connection with the contact J1, and the contact J4 is in electrical connection with the contact J2 when the second coupler socket and the first coupler socket are snap-connected.

Optionally, the first device also includes a first connector. The first connector is installed on the first housing and penetrates through the first housing. A first end of the first connector is electrically connected to the controller MCU1.

The second device also includes a second connector. The second connector is installed on the second housing and penetrates through the second housing. A first end of the second connector is electrically connected to the controller MCU2.

A second end of the second connector is configured to be electrically connected to a second end of the first connector through a first cable.

Optionally, the first device also includes a third connector. The third connector is installed on the first housing and penetrates through the first housing. A first end of the third connector is in electrical connection with the first voltage terminal V1.

The second device also includes a fourth connector. The fourth connector is installed on the second housing and penetrates through the second housing.

The second end of the fourth connector is configured to be electrically connected to the second end of the third connector through a second cable.

BRIEF DESCRIPTION OF DRAWINGS

In order to illustrate the embodiments of the present application more clearly, the following will briefly introduce the drawings that need to be used for describing the embodiments. Obviously, the drawings in the following description are merely some embodiments of the present application, and for those of ordinarily skills in the art, other drawings may also be obtained according to these drawings on the premise of paying no creative labor.

Figure 1:
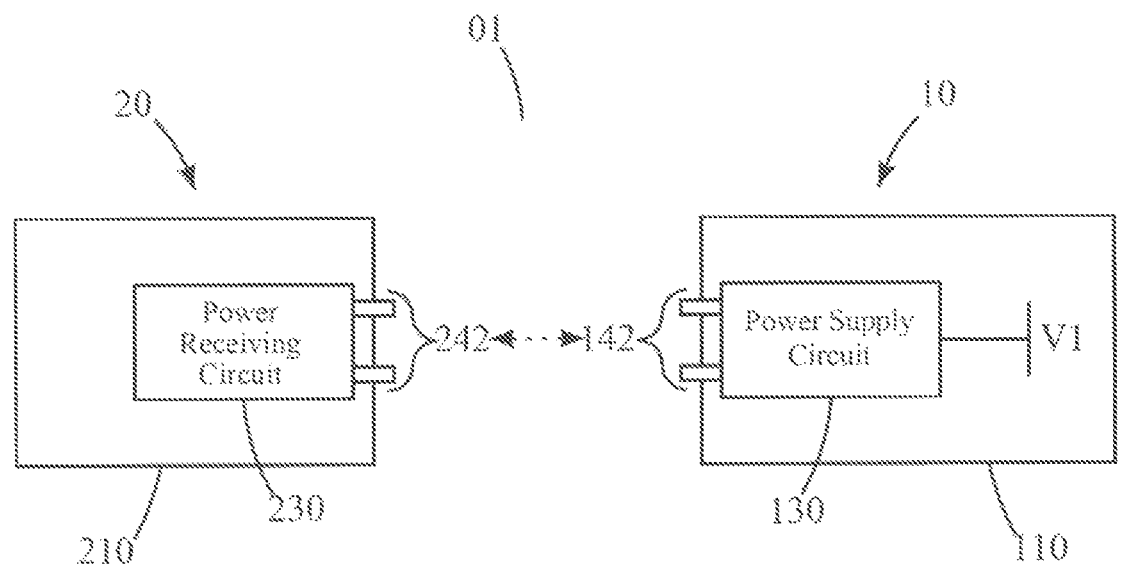
FIG. 1 is a schematic structural diagram of a first type of power supply system in accordance with an embodiment of the present application.

Reference numerals in the figures are listed as follows: 01—power supply system; 10—first equipment; 110—first housing; 120—first coupler socket; 130—power supply circuit; 142—first set of contacts; 144—third set of contacts; 150—physical field sensor; 152—Hall sensor; 154—reed switch; 160—first communication circuit; 172—first connector; 174—third connector; 20—second equipment; 210—second housing; 220—second coupler socket; 230—power receiving circuit; 242—second set of contacts; 244—fourth set of contacts; 250—field component; 260—second communication circuit; 272—second connector; and 274—fourth connector.

DETAILED DESCRIPTION OF EMBODIMENTS

In order to illustrate the objectives, schemes and advantages of the present application more clearly, the embodiments of the present application will be further described in detail below with reference to the drawings.

It should be understood that the term "multiple" as mentioned in this disclosure refers to two or more. In the description of this disclosure, unless otherwise specified, the symbol "I" has an or meaning, for example, A/B may mean A or B. The wording "and/or" as used herein is simply an association relationship that describes associated objects, indicating that more than three kinds of relationships may be included, for example, A and/or B, may include the following three cases, that is, A exists alone, A and B exist at the same time, and B exists alone. In addition, in order to facilitate the clear description of the schemes of the present application, words such as "first" and "second" are used to distinguish the same items or similar items having basically the same function and effect. It can be understood for those skilled in the art that the words "first", "second" and the like do not limit the quantity and execution order, and also the words "first", "second" and the like are not necessarily different.

The power supply system provided by the embodiments of the present application will be illustrated in detail below with reference to the drawings.

FIG. 1 is a schematic structural diagram of a power supply system 01 in accordance with an embodiment of the present application. As shown in FIG. 1, the power supply system 01 includes a first device 10 and a second device 20. The first device 10 may be one of a control device and a film-and-television light, and the second device 20 may be the other of the control device and the film-and-television light. In each embodiment of the present application, the first device 10 is used to supply power to the second device 20. That is, the control device may receive power from the film-and-television light, when the first device 10 is the film-and-television light and the second device 20 is the control device. The film-and-television light may receive power from the control device, when the second device 20 is the film-and-television light and the first device 10 is the control device. The control device herein may include a touch display, keys, etc., so that the user can input control instructions through a touch function of the control device. The electrical energy here should be understood in a broad sense, that is, as long as electrical signals are transmitted, specifically, the electrical energy may include electrical signals for power supply, electrical signals for communication data, electrical signals for driving, and the like.

Figure 2:
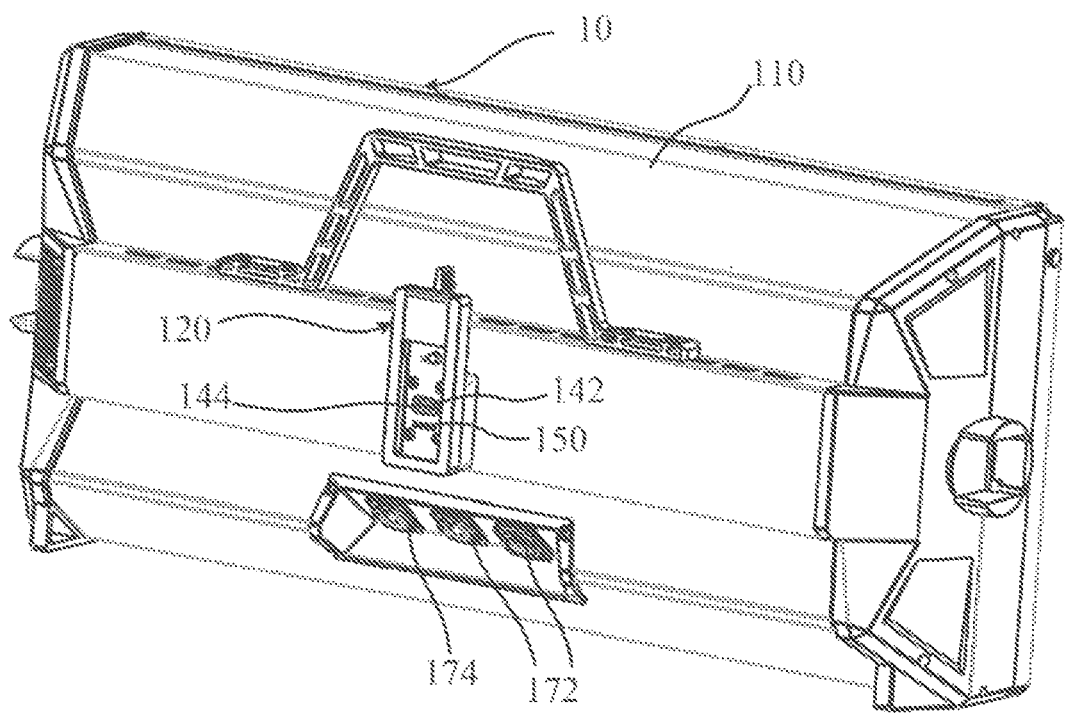
FIG. 2 is a schematic structural diagram of a first device in accordance with an embodiment of the present application.

FIG. 2 is a schematic structural diagram of a first device 10 in accordance with an embodiment of the present application. As shown in FIGS. 1 and 2, the first device 10 includes a first housing 110, a first coupler socket 120, a power supply circuit 130 and a first set of contacts 142.

For the first device 10, the first housing 110 is configured to provide an inner cavity capable of accommodating other devices, so that other devices such as the power supply circuit 130 other than the first housing 110 can be located in the inner cavity of the first housing 110. In case that the first device 10 is a film-and-television light, the first device 10 may also include a light-emitting device, such as a light-emitting diode, a quantum dot light-emitting tube or an organic light-emitting object, etc., and the light-emitting device may also be located in the inner cavity of the first housing 110. In case that the first device 10 is a control device, the first device 10 may also include devices such as a central processing unit for realizing the touch-display function, and the devices such as the central processing unit may also be located in the inner cavity of the first housing 110. The first housing 110 may be made of plastic, metal, acrylic or other materials, which will not be described in detail here.

The first coupler socket 120 may be configured to form a snap connection with the second device 20, so that a connection between the first device 10 and the second device 20 can be established. The first coupler socket 120 is located on an outer surface of the first housing 110, and the first coupler socket 120 may form a fixed connection with the first housing 110. The fixed connection here means that the relative positional relationship between the first coupler socket 120 and the first housing 110 remains fixed.

The first set of contacts 142 is installed on the first coupler socket 120 and penetrate through the first housing 110. The first set of contacts 142 may include one contact or multiple contacts. In case that the first set of contacts 142 includes only one contact, then one through hole is defined on the first coupler socket 120 for an installation of the only one contact 142. Meanwhile, the first housing 110 is also defined with a through hole, and the position of the through hole on the first housing 110 corresponds to the position of the through hole on the first coupler socket 120, to enable the contact 142 installed at the through hole of the first coupler socket 120 to pass through the first housing 110 through the through hole of the first housing 110. In case that the first set of contacts 142 includes multiple contacts, then multiple through holes are defined on the first coupler socket 120 and the first housing 110 respectively, and each through hole on the first coupler socket 120 is configured for a contact to be installed. The positions of multiple through holes on the first housing 110 and the positions of multiple through holes on the first coupler socket 120 are in a one-to-one correspondence, to enable the multiple contacts installed on the multiple through holes of the first coupler socket 120 to pass through the first housing 110 through the multiple through holes of the first housing 110 respectively. Generally, the first set of contacts 142 may have a material of metal, so that the first set of contacts 142 can conduct electricity. In some specific embodiments, each contact in the first set of contacts 142 is an elastic contact pin such as a Pogo pin.

The power supply circuit 130 located in the inner cavity of the first housing 110 has an input end and an output end. The input end of the power supply circuit 130 may be electrically connected to a first voltage terminal V1. The first voltage terminal V1 is configured to output a voltage. In some embodiments, the voltage output from the first voltage terminal V1 may be 18V (volts). The output end of the power supply circuit 130 may be electrically connected to the first set of contacts 142 penetrating through the first housing 110. As such, the voltage from the first voltage terminal V1 can be output to the first set of contacts 142 through the power supply circuit 130. In some specific embodiments, the first voltage terminal V1 may be an output end of a first voltage-conversion circuit. The input end of the first voltage-conversion circuit may be electrically connected to mains or other external power sources. The first voltage-conversion circuit is configured to convert the voltage output from the mains or other external power sources into a DC voltage of 18V and output the DC voltage of 18V. Thus, the first voltage-conversion circuit may include at least one of a rectifier circuit and a buck circuit.

Figure 3:
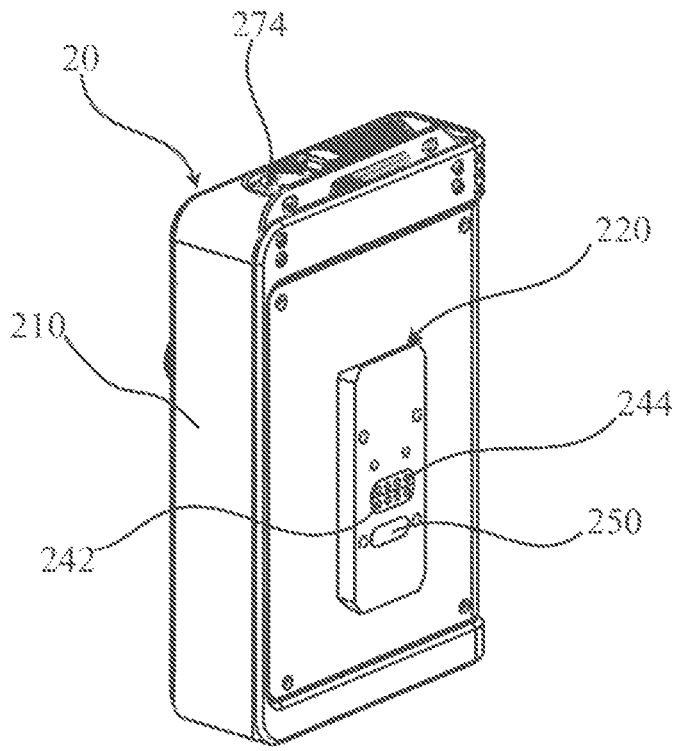
FIG. 3 is a schematic structural diagram of a second device in accordance with an embodiment of the present application.

FIG. 3 is a schematic structural diagram of a second device 20 in accordance with an embodiment of the present application. As shown in FIGS. 1 and 3, the second device 20 includes a second housing 210, a second coupler socket 220, a power receiving circuit 230 and a second set of contacts 242.

For the second device 20, the second housing 210 is configured to provide an inner cavity capable of accommodating other devices, so that other devices such as the power receiving circuit 230 other than the second housing 210 can be located in the inner cavity of the second housing 210. In case that the second device 20 is a film-and-television light, the second device 20 may also include a light-emitting device, and the light-emitting device may also be located in the inner cavity of the second housing 210. In case that the second device 20 is a control device, the second device 20 may also include devices such as a central processing unit for realizing the touch-display function, and the devices such as the central processing unit may also be located in the inner cavity of the second housing 210. The second housing 210 may be made of plastic, metal, acrylic or other materials, which will not be described in detail here.

The second coupler socket 220 may be configured to form a snap connection with the first device 10, so that a connection between the second device 20 and the first device 10 can be established. The second coupler socket 220 is located on an outer surface of the second housing 210, and the second coupler socket 220 may form a fixed connection with the second housing 210. The fixed connection here means that the relative positional relationship between the second coupler socket 220 and the second housing 210 remains fixed.

The second set of contacts 242 is installed on the second coupler socket 220 and penetrates through the second housing 210. The second set of contacts 242 may include one contact or multiple contacts. In case that the second set of contacts 242 includes only one contact, then one through hole is defined on the second coupler socket 220 for an installation of the only one contact 242. Meanwhile, the second housing 210 is also defined with a through hole, and the position of the through hole on the second housing 210 corresponds to the position of the through hole on the second coupler socket 220, to enable the only one contact 242 installed at the through hole of the second coupler socket 220 to pass through the second housing 210 through the through hole of the second housing 210. In case that the second set of contacts 242 includes multiple contacts, then multiple through holes may be defined on the second coupler socket 220 and the second housing 210 respectively, and each through hole on the second coupler socket 220 is configured for a contact to be installed. The positions of multiple through holes on the second housing 210 and the positions of multiple through holes on the second coupler socket 220 are in a one-to-one correspondence, to enable the multiple contacts installed at the multiple through holes of the second coupler socket 220 to pass through the second housing 210 through the multiple through holes on the second housing 210, respectively. Generally, the number of contacts in the second set of contacts 242 is equal to the number of contacts in the first set of contacts 142. The second set of contacts 242 may have a material of metal, so that the second set of contacts 242 can conduct electricity. In some specific embodiments, each contact in the second set of contacts 242 is an elastic contact pin such as a Pogo pin.

The power receiving circuit 230 located in the inner cavity of the second housing 210 has an input end. The input end of the power receiving circuit 230 may be electrically connected to the second set of contacts 242 penetrating through the second housing 210. The power receiving circuit 230 may also have an output end, and the output end of the power receiving circuit 230 is electrically connected to and to other devices (such as a central processing unit, etc.) in the second device 20 that require electric energy, to supply power to these devices that require electric energy in the second device 20.

In the embodiments of the present application, the second coupler socket 220 of the second device 20 is configured to form a snap connection with the first coupler socket 120 of the first device 10. The second set of contacts 242 are in contact with the first set of contacts 142 to achieve an electrical connection when the first coupler socket 120 is in a snap-connection with the first coupler socket 220. In this way, the first device 10 and the second device 20 are connected when the second coupler socket 220 is in a snap connection with the first coupler socket 120. Meanwhile, the voltage from the first voltage terminal V1 may be output to the power receiving circuit 230 through the power supply circuit 130, the first set of contacts 142 and the second set of contacts 242, so as to supply power to the second device 20. In the power supply system 01, the first device 10 and the second device 20 can be connected when a snap connection is formed between first coupler socket 120 and second coupler socket 220, and an electrical connection is formed between the first set of contacts 142 and the second set of contacts 242 when the first coupler socket 120 and the second coupler socket 220 are snap-connected, so that the electrical connection can be formed between the first device 10 and the second device 20 without requiring a long cable, thereby simplifying the connection manner between the first device 10 and the second device 20.

Figure 4:
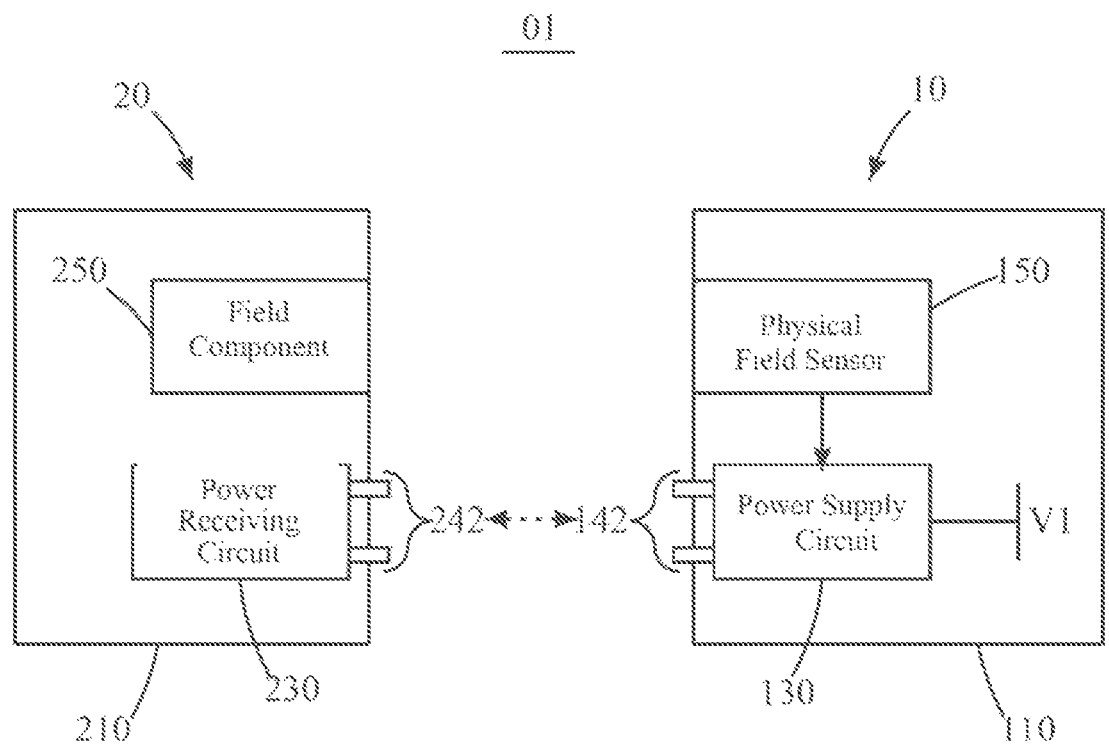
FIG. 4 is a schematic structural diagram of a second type of power supply system in accordance with an embodiment of the present application.

FIG. 4 is a schematic structural diagram of another power supply system 01 in accordance with an embodiment of the present application. As shown in FIG. 4, in some embodiments, the second device 20 may also include a field component 250, and the first device 10 may also include a physical field sensor 150.

The field component 250 may be a device for generating an electric field or a device for generating a magnetic field. The field component 250 may be a capacitor electrically connected to a power source when the field component 250 is a device for generating an electric field. The field component 250 may be a permanent magnet when the field component 250 is a device for generating a magnetic field, to generate a stationary magnetic field. The field component 250 is located in the inner cavity of the second housing 210 and is connected to the second housing 210. Generally, the field component 250 is fixedly connected to the second housing 210 so that the relative position of the field component 250 and the second housing 210 remains fixed.

The physical field sensor 150 is configured to sense a physical field generated by the field component 250. Thus, when the field component 250 is a device for generating an electric field, the physical field sensor 150 is used for inducing an electric field, and then the physical field sensor 150 may be an electric field sensor, etc.; when the field component 250 is a device for generating a magnetic field, the physical field sensor 150 is used for sensing a magnetic field, and then the physical field sensor 150 may be a Hall sensor 152 or a reed switch 154, etc. In an embodiment of the present application, in case that the first device 10 and the second device 20 are snap-connected through the first coupler socket 120 and the second coupler socket 220, the physical field sensor 150 is configured to output an on-signal under the action of the physical field generated by the field component 250 of the second device 20. The on-signal here is an electrical signal, such as a high-level signal or a low-level signal. That is, in the embodiment of the present application, the physical field sensor 150 is configured to sense the physical field generated by the field component 250 and output the on-signal when and only when a snap connection is formed between the first coupler socket 120 and the second coupler socket 220.

The physical field sensor 150 may have an output end, and the output end of the physical field sensor 150 is used to output an on-signal. The power supply circuit 130 also has a control end. The control end of the power supply circuit 130 is used to control the on and off of a conduction between the input end and the output end of the power supply circuit 130. The voltage from the first voltage terminal V1 may be output to the first set of contacts 142 through the power supply circuit 130 when the conduction between the input end and the output end of the power supply circuit 130 is turned on; otherwise, when the conduction between the input end and the output end of the power supply circuit 130 is turned off, the voltage from the first voltage terminal V1 may not be output to the first set of contacts 142 through the power supply circuit 130. The control end of the power supply circuit 130 is electrically connected to the output end of the physical field sensor 150, so that the conduction between the input end and the output end of the power supply circuit 130 is turned on when an on-signal is output from the physical field sensor 150, and the conduction between the input end and the output end of the power supply circuit 130 is turned off when no on-signal is output from the physical field sensor 150. As such, the on-signal may be output from the physical field sensor 150 when and only when a snap connection is formed between the first coupler socket 120 and the second coupler socket 220, indicating that the conduction between the input end and the output end of the power supply circuit 130 is turned on, and then the output end of the power supply circuit 130 is provided with a voltage. In this circumstance, the output end of the power supply circuit 130 can be prevented from having a voltage when the first device 10 and the second device 20 are not snap-connected through the first coupler socket 120 and the second coupler socket 220, thereby preventing electric shock caused when the human body touches the first set of contacts, and thus the safety of the power supply system 01 can be improved.

In some embodiments, as shown in FIG. 4, the output end of the physical field sensor 150 may be directly electrically connected to the control end of the power supply circuit 130, so that the conduction between the input end and the output end of the power supply circuit 130 is turned on when an on-signal is output from the physical field sensor 150; and the conduction between the input end and the output end of the power supply circuit 130 is turned off when no on-signal is output from the physical field sensor 150.

Figure 5:
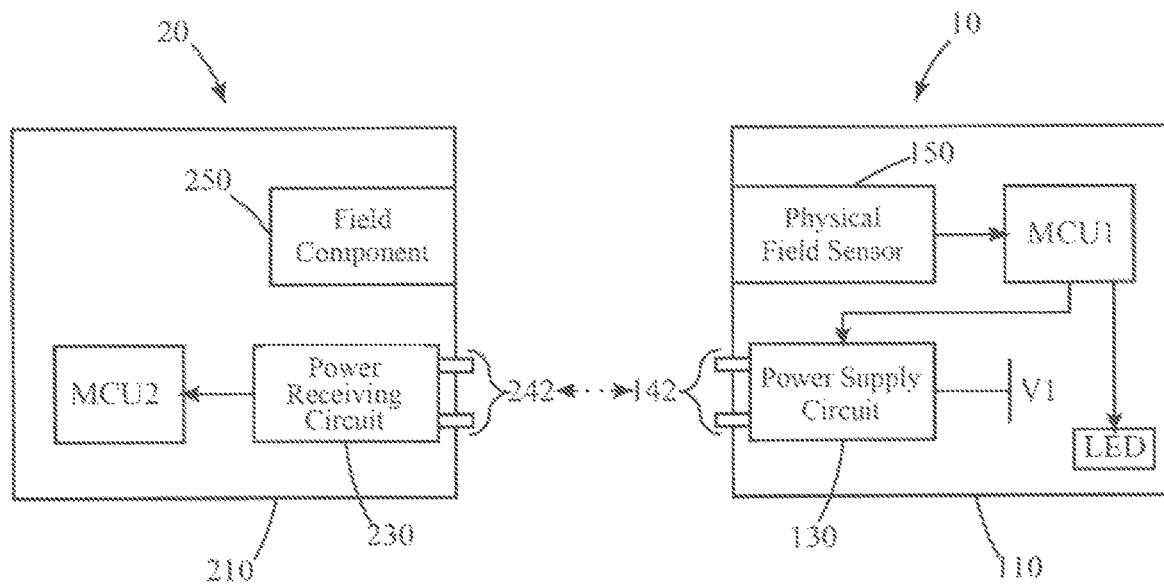
FIG. 5 is a schematic structural diagram of a third type of power supply system in accordance with an embodiment of the present application.

In other embodiments, as shown in FIG. 5, the first device 10 may also include a controller MCU1, the controller MCU1 is located in the inner cavity of the first housing 110, and the controller MCU1 may be a single-chip microcomputer. The output end of the physical field sensor 150 is electrically connected to the control end of the power supply circuit 130 through the controller MCU1. In this way, the conduction between the input end and the output end of the power supply circuit 130 is controlled by the controller MCU1 to be turned on when an on-signal is output from the physical field sensor 150 to the controller MCU1; and the conduction between the input end and the output end of the power supply circuit 130 is controlled by the controller MCU1 to be turned off when no on-signal is output from the physical field sensor 150.

In the embodiment shown in FIG. 5, the second device 20 may also include a controller MCU2, the controller MCU1 is located in the inner cavity of the second housing 210, and the controller MCU2 may also be a single-chip microcomputer. The output end of the power receiving circuit 230 is electrically connected to an output end of the controller MCU2, so as to supply power through the power receiving circuit 230 to the controller MCU2 when the voltage from the first voltage terminal V1 is output, via the power supply circuit 130, the first set of contacts 142 and the second set of contacts 242, to the power receiving circuit 230, thereby enabling the second device 20 to be powered and to work. Meanwhile, in the embodiment shown in FIG. 5, the first device 10 may also include a light emitting device LED. The light-emitting device LED is electrically connected to the controller MCU1, so as to control the light emitting of the light-emitting device LED through the controller MCU1. In this circumstance, the first device 10 is a film-and-television light, and the second device 20 is a control device.

In the following, two different implementations of the physical field sensor 150 will be explained in detail by taking the embodiment in which the field component 250 is a magnet as an example.

Figure 6:
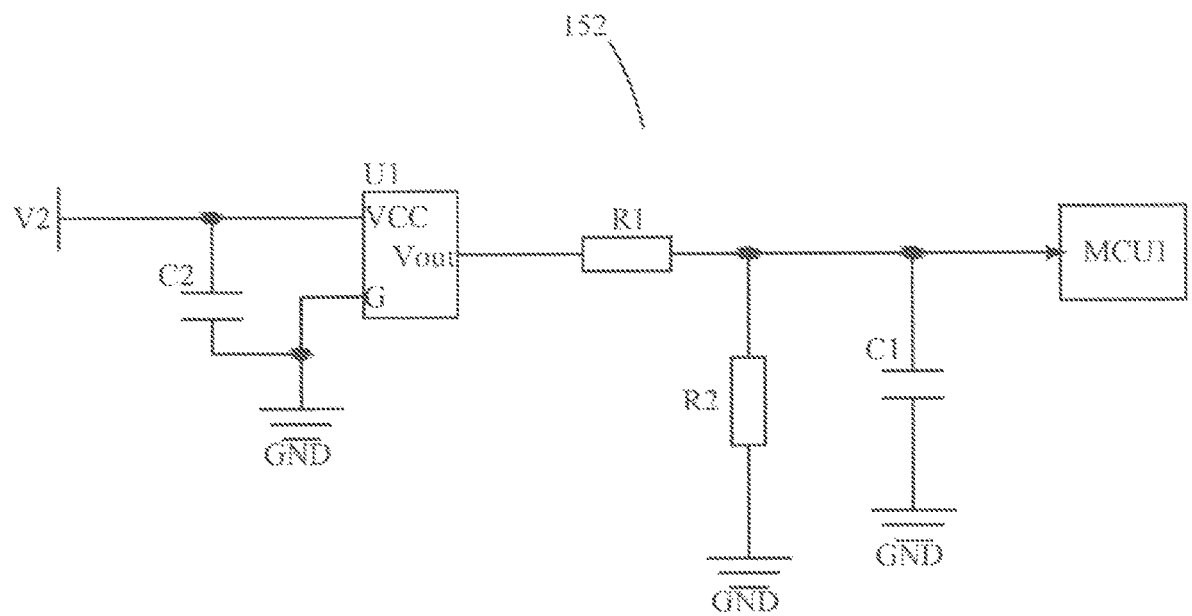
FIG. 6 is a circuit structure diagram of a Hall sensor in accordance with an embodiment of the present application.

In a first possible implementation, the field component 250 is a magnet, and the physical field sensor 150 may be a Hall sensor 152. FIG. 6 is a circuit structure diagram of a physical field sensor 150 in accordance with an embodiment of the present application. As shown in FIG. 6, the Hall sensor 152 includes a Hall sensor chip U1, a resistor R1, a resistor R2 and a capacitor C1.

A power-supply pin VCC of the Hall sensor chip U1 may be electrically connected to the second voltage terminal V2, a ground pin G of the Hall sensor chip U1 may be electrically connected to the ground wire GND, and the voltage from the second voltage terminal V2 is greater than the voltage of the ground wire GND. In some embodiments, the voltage of the second voltage terminal V2 may be 5V. In some specific embodiments, the second voltage terminal V2 may be an output end of a second voltage-conversion circuit. The input end of the second voltage-conversion circuit may be electrically connected to the mains or other external power sources, or the first voltage terminal V1. The second voltage-conversion circuit is configured to convert the voltage output from the mains or other external power sources, or the first voltage terminal V1 into a DC voltage of 5V and output the DC voltage of 5V. Thus, the second voltage-conversion circuit may include at least one of a rectifier circuit and a buck circuit.

A first end of the resistor R1 is electrically connected to an output pin Vout of the Hall sensor chip U1, and a second end of the resistor R1 is electrically connected to a first end of the resistor R2. Meanwhile, the second end of the resistor R1 serves as the output end of the physical field sensor 150 for outputting an on-signal. That is to say, when the output end of the physical field sensor 150 is electrically connected to the control end of the power supply circuit 130 through the controller MCU1, as shown in FIG. 6, the second end of the resistor R1 is electrically connected to the controller MCU1. The second end of the resistor R1 is electrically connected to the control end of the power supply circuit 130 when the output end of the inductor 150 is directly electrically connected to the control end of the power supply circuit 130.

A second end of the resistor R2 may be electrically connected to the ground wire GND, so as to divide the voltage between the first resistor R1 and the second and second resistors R2.

A first electrode plate of the capacitor C1 is electrically connected to the second end of the resistor R1, and a second electrode plate of the capacitor C1 is electrically connected to the ground wire GND. The capacitor C1 may be a voltage-stabilizing capacitor, to enable the voltage of the on-signal output from the physical field sensor 150 to remain stable.

In this implementation, the on-signal is a high-level signal. In case that the first coupler socket 120 and the second coupler socket 220 are snap-connected, a high-level signal may be output to the controller MCU1 or the control end of the power supply circuit 130 through the Hall sensor chip U1 under the action of the magnetic field generated by the magnet. In case that the first coupler socket 120 and the second coupler socket 220 are disconnected, the Hall sensor chip U1 does not output the high-level signal, that is, no on-signal is output.

In the embodiment shown in FIG. 6, the Hall sensor 152 may also include a capacitor C2. The capacitor C2 is electrically connected between the power-supply pin VCC of the Hall sensor chip U1 and the ground pin G, so as to stabilize the input voltage at the power-supply pin VCC of the Hall sensor chip U1.

Figure 7:
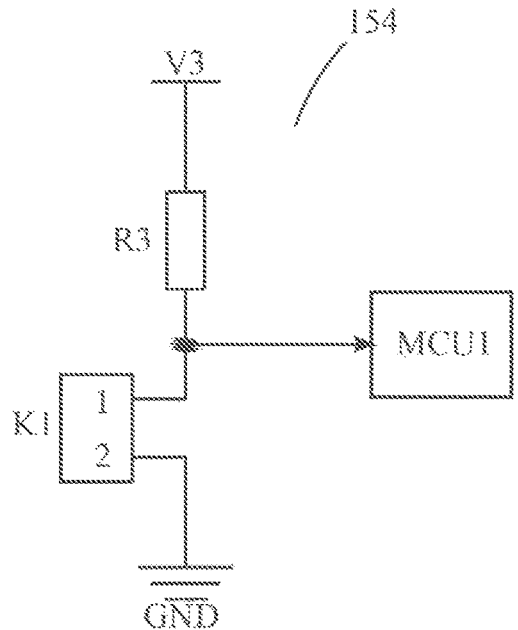
FIG. 7 is a circuit structure diagram of a reed switch in accordance with an embodiment of the present application.

In a second possible implementation, the field component 250 is a magnet, and the physical field sensor 150 may be a reed switch 154. FIG. 7 is a circuit structure diagram of another physical field sensor 150 in accordance with an embodiment of the present application. As shown in FIG. 7, the reed switch 154 includes a resistor R3 and a magnetic sensitive switch K1.

A first end of the resistor R3 may be electrically connected to a third voltage terminal V3, and a second end of the resistor R3 is electrically connected to a first end of the magnetic sensitive switch K1. Meanwhile, the second end of the resistor R3 serves as the output end of the physical field sensor 150 for outputting an on-signal. That is to say, the second end of the resistor R3 is electrically connected to the controller MCU1 when the output end of the physical field sensor 150 is electrically connected to the control end of the power supply circuit 130 through the controller MCU1, as shown in FIG. 7. The second end of the resistor R3 is electrically connected to the control end of the power supply circuit 130 when the output end of the physical field sensor 150 is directly electrically connected to the control end of the power supply circuit 130.

A second end of the magnetic sensitive switch K1 may be electrically connected to the ground wire GND, and the voltage from the third voltage terminal V3 is greater than the voltage of the ground wire GND. In some embodiments, the voltage of the third voltage terminal V3 is 3.3V. In some specific embodiments, the third voltage terminal V3 may be an output end of a third voltage-conversion circuit. The input end of the third voltage-conversion circuit may be electrically connected to the mains, the other external power sources, the first voltage terminal V1 or the second voltage terminal V2. The third voltage-conversion circuit is configured to convert the voltage output from the mains, the other external power sources, the first voltage terminal V1 or the second voltage terminal V2 into a DC voltage of 3.3V and output the DC voltage of 3.3V. Thus, the third voltage-conversion circuit may include at least one of a rectifier circuit and a buck circuit.

In this implementation, the on-signal is a low-level signal. In case that the first coupler socket 120 and the second coupler socket 220 are snap-connected, the magnetic sensitive switch K1 is turned on under the action of the magnetic field generated by the magnet. At this time, the second end of the resistor R3 is electrically connected to the ground wire GND and thus a low-level signal is output from the second end of the resistor R3. In case that the first coupler socket 120 and the second coupler socket 220 are disconnected, the magnetic sensitive switch K1 is turned off, and then the voltage at the second end of the resistor R3 is equal to the voltage from the third voltage terminal V3, that is, no on-signal is output from the second end of the resistor R3 is at this time.

In the following, the implementation of the power supply circuit 130 will be exampled in detail, in case that the conduction between the input end and the output end of the power supply circuit 130 is turned on when a high-level signal is input to the control end of the power supply circuit 130.

Figure 8:
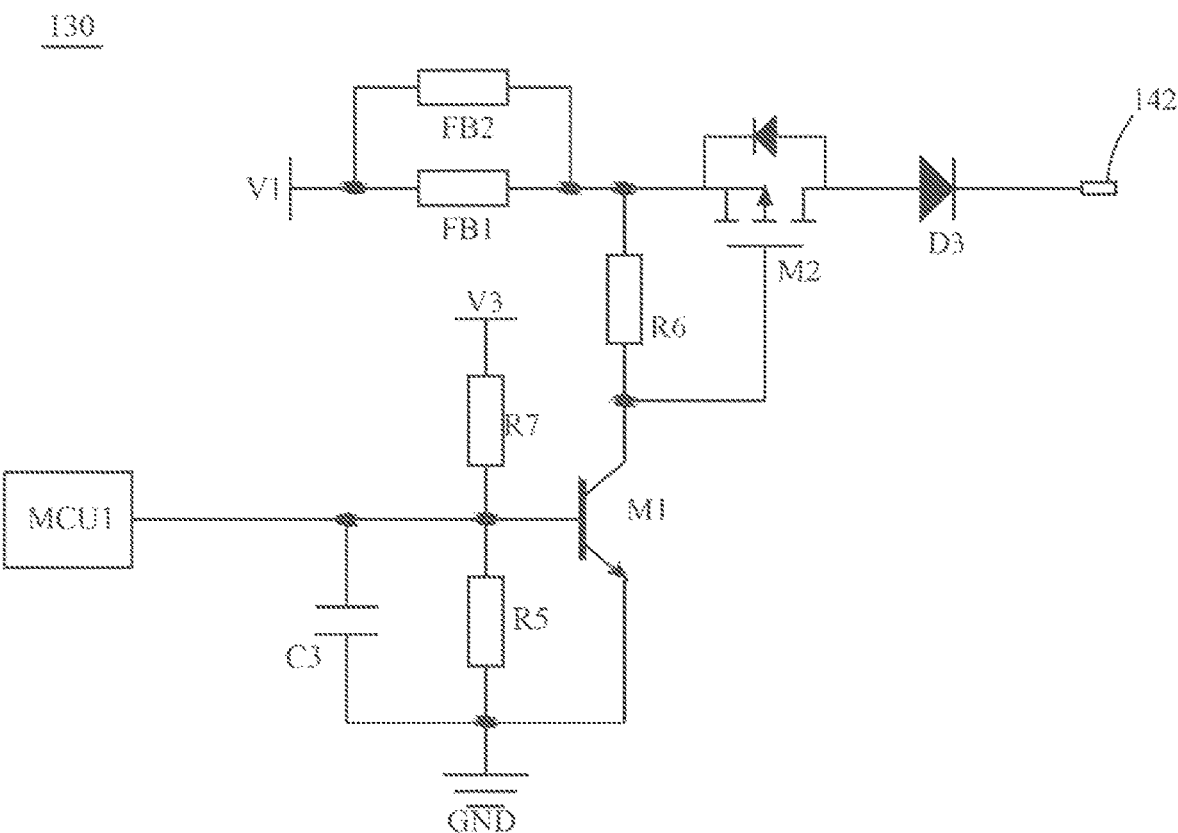
FIG. 8 is a circuit structure diagram of a power supply circuit in accordance with an embodiment of the present application.

The high-level signal input to the control end of the power supply circuit 130 may be a high-level on-signal output from the physical field sensor 150, or may be a high-level signal output by the controller MCU1 after acquiring the on-signal. FIG. 8 is a circuit structure diagram of the power supply circuit 130 in accordance with an embodiment of the present application. In the embodiment shown in FIG. 8, the high-level signal input to the control end of the power supply circuit 130 is high-level signal output by the controller MCU1 after acquiring the on-signal.

The power supply circuit 130 may include a transistor M1 and a transistor M2. A control electrode of the transistor M1 serves as the control end of the power supply circuit 130. In case that the high-level signal input to the control end of the power supply circuit 130 is the high-level turn-on signal output from the physical field sensor 150, the control electrode of the transistor M1 is electrically connected to the output end of the physical field sensor 150. In case that the high-level signal input to the control end of the power supply circuit 130 is the high-level signal output from the controller MCU1 after acquiring the on-signal, as shown in FIG. 8, the control electrode of the transistor M1 is electrically connected to the controller MCU1. A first electrode of the transistor M1 is electrically connected to a control electrode of the transistor M2, and a second electrode of the transistor M1 is electrically connected to the ground wire GND. A first electrode of the transistor M2 serves as the input end of the power supply circuit 130 for being electrically connected to the first voltage terminal V1. A second electrode of the transistor M2 serves as the output end of the power supply circuit 130 for being electrically connected to the first set of contacts 142.

In the embodiment shown in FIG. 8, the transistor M1 is an NPN triode, the control electrode of the transistor M1 is the base of the NPN triode, the first electrode of the transistor M1 is the collector of the NPN triode, and the second electrode of the transistor M1 is the NPN triode the emitter of the triode. The transistor M2 may be a P-type MOS (metal oxide semiconductor) field effect transistor (a PMOS transistor, hereinafter). The control electrode of the transistor M2 is the gate electrode of the PMOS transistor, the first electrode of the transistor M2 is the source electrode of the PMOS transistor, and the second electrode of the transistor M2 is the drain electrode of the PMOS transistor. During an operation of the power supply circuit 130, the transistor M1 is turned on when a high-level signal is input to the control electrode of the transistor M1, and at this time, the control electrode of the transistor M2 is electrically connected to the ground wire GND. Since the transistor M2 is a PMOS transistor, the transistor M2 is turned on at a low-level, that is, the conduction between the input end and the output end of the power supply circuit 130 is turned on. On the contrary, when a low-level signal is input to the control electrode of the transistor M1, the transistor M1 is turned off, the transistor M2 is also turned off, and then the conduction between the input end and the output end of the power supply circuit 130 is turned off.

In the embodiment shown in FIG. 8, the power supply circuit 130 also includes a resistor R5, a resistor R6 and a resistor R7. The resistor R5 is electrically connected between the control electrode and the second electrode of the transistor M1. The resistor R6 is electrically connected between the first electrode and the control electrode of the transistor M2. The resistor R7 is electrically connected between the third voltage terminal V3 and the control electrode of the transistor M1. The voltage from the third voltage terminal V3 may be 3.3V, and the resistance of the resistor R7 may be smaller than the resistance of the resistor R5, for example, the resistance of the resistor R7 may be one-sixth of the resistance of the resistor R5. In this way, for the embodiment shown in FIG. 8, in case that the controller MCU1 does not output a high-level signal, the voltage at the control electrode of the transistor M1 may be one-seventh of the voltage from the third voltage terminal V3, i.e., about 0.5V, due to a voltage division of the resistor R7 and the resistor R5. In this circumstance, it can be ensured that the transistor M1 is turned off when the controller MCU1 does not output a high-level signal. In some specific embodiments, the resistance of the resistor R7 and the resistance of the resistor R5 may be determined according to the voltage of the third voltage terminal V3.

In the embodiment shown in FIG. 8, the power supply circuit 130 also includes a capacitor C3. The capacitor C3 is electrically connected between the control electrode of the transistor M1 and the ground wire GND, so as to stabilize the voltage input to the control electrode of the transistor M1. The power supply circuit 130 also includes a magnetic bead FB1 and a magnetic bead FB2. The magnetic bead FB1 and the magnetic bead FB2 are connected in parallel and electrically connected between the first voltage terminal V1 and the first electrode of the transistor M2, so as to suppress high-frequency noise and peak interference and absorb electrostatic pulses. The power supply circuit 130 also includes a diode D3. An anode of the diode D3 is electrically connected to the second electrode of the transistor M2, and a cathode of the diode D3 is electrically connected to the first set of contacts 142, so as to prevent current backflow.

Figure 9:
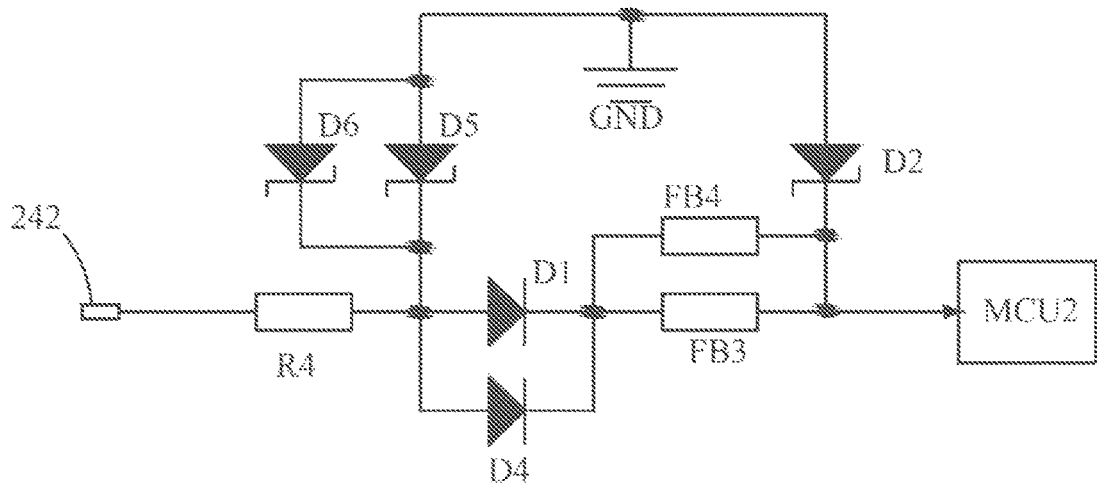
FIG. 9 is a circuit structure diagram of a power receiving circuit in accordance with an embodiment of the present application.

FIG. 9 is a circuit structure diagram of a power receiving circuit 230 in accordance with an embodiment of the present application. As shown in FIG. 9, in some embodiments, the power receiving circuit 230 includes a resistor R4, a diode D1 and a Zener diode D2.

A first end of the resistor R4 serves as the input end of the power receiving circuit 230, and the first end of the resistor R4 is electrically connected to the second set of contacts 242. A second end of the resistor R4 is electrically connected to an anode of the diode D1, and a cathode of diode D1 is used to output power. An anode of the Zener diode D2 is electrically connected to the ground wire GND, and a cathode of the Zener diode D2 is electrically connected to the cathode of the diode D1.

In the embodiment shown in FIG. 9, the power receiving circuit 230 also includes a diode D4, a Zener diode D5 and a Zener diode D6. The diode D4 is connected in parallel with the diode D1. A cathode of the Zener diode D5 is electrically connected to the second end of the resistor R4, and an anode of the Zener diode D5 is electrically connected to the ground wire GND. The Zener diode D6 is connected in parallel with the Zener diode D5. The power receiving circuit 230 also includes a magnetic bead FB3 and a magnetic bead FB4. The magnetic bead FB3 and the magnetic bead FB4 are connected in parallel, and are electrically connected between the cathode of the diode D1 and the control MCU2. In this circumstance, the cathode of diode D1 is configured to output power through magnetic beads FB3 and FB4. The cathode of the Zener diode D2 may be electrically connected to the cathode of the diode D1 through the magnetic beads FB3 and FB4.

Figure 10:
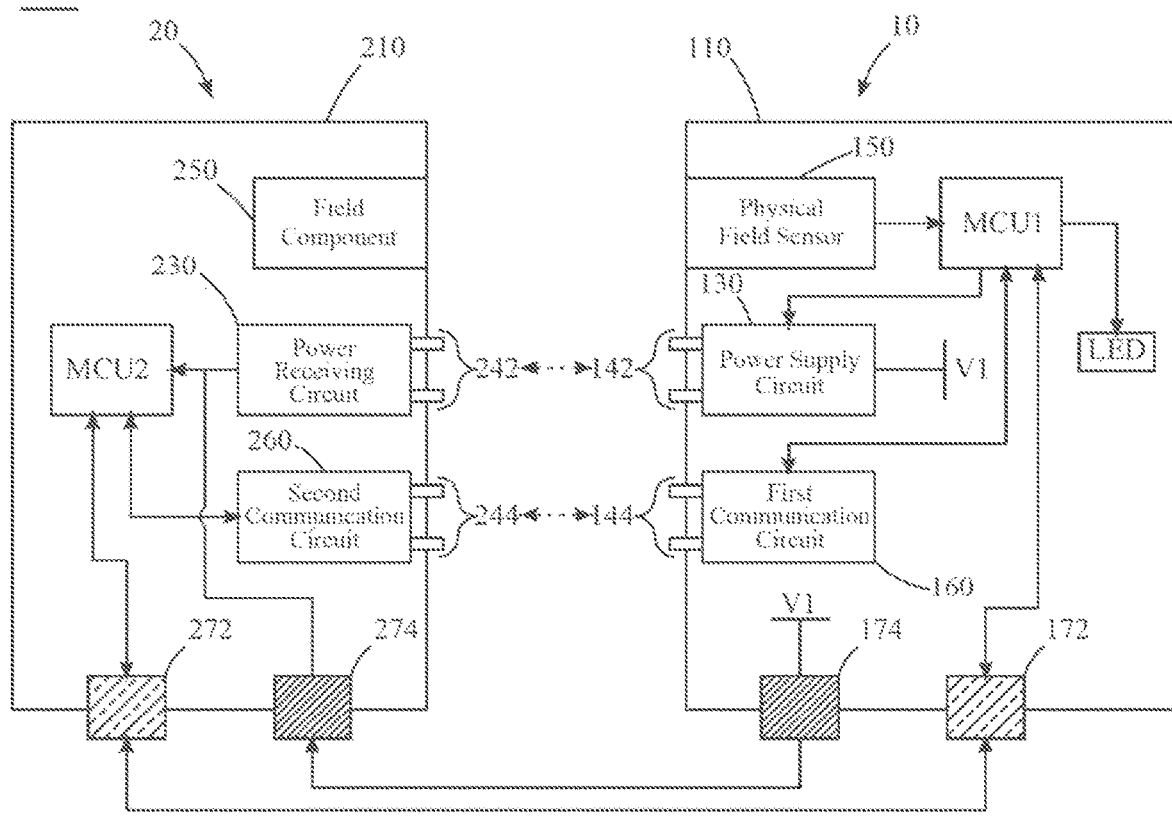
FIG. 10 is a schematic structural diagram of a fourth type of power supply system in accordance with an embodiment of the present application.

FIG. 10 is a schematic structural diagram of yet another power supply system 01 in accordance with an embodiment of the present application. In the embodiment shown in FIG. 10, the first device 10 may also be in communication with the second device 20. As shown in FIG. 2 and FIG. 10, the first housing 110, the first coupler socket 120, the power supply circuit 130 and the first set of contacts 142 that are included in the first device 10 will not be described here again. The first device 10 also includes a controller MCU1, a first communication circuit 160 and a third set of contacts 144.

The third set of contacts 144 is installed on the first coupler socket 120 and penetrates through the first housing 110. The third set of contacts 144 may include one contact or multiple contacts. In case that the third set of contacts 144 includes only one contact, the contact is installed on the first coupler socket 120, and then one through hole is defined on the first housing 110 at a position corresponding to the contact, so that the contact 144 installed on the first coupler socket 120 penetrates through the first housing 110 through the through hole. In case that the third set of contacts 144 includes multiple contacts, each contact in the third set of contacts 144 is installed on the first coupler socket 120, and then multiple through holes may be defined on the first housing 110 at positions corresponding to the multiple contacts, respectively, so that each contact of the third set of contacts 144 installed on the first coupler socket 120 penetrates through the first housing 110 through the corresponding through hole of the first housing 110. Generally, the third set of contacts 144 includes two contacts, and each contact in the third set of contacts 144 is made of metal material, so that each contact can conduct electricity. In some specific embodiments, each contact in the third set of contacts 144 is an elastic contact pin such as a Pogo pin.

Both the controller MCU1 and the first communication circuit 160 are located in the inner cavity of the first housing 110, and the controller MCU1 may be a single-chip microcomputer. The first communication circuit 160 has a first end and a second end. The first end of the first communication circuit 160 may be electrically connected to the controller MCU1, and the second end of the first communication circuit 160 may be electrically connected to the third set of contacts 144. In this way, the electrical signal output by the controller MCU1 can be output to the third set of contacts 144 through the first communication circuit 160, and the electrical signal of the third set of contacts 144 can also be input to the controller MCU1 through the first communication circuit 160.

As shown in FIG. 2 and FIG. 10, the second housing 210, the second coupler socket 220, the power receiving circuit 230 and the second set of contacts 242 that are included in the second device 20 will not be described here again. The second device 20 also includes a controller MCU2, a second communication circuit 260 and a fourth set of contacts 244.

The fourth set of contacts 244 is installed on the second coupler socket 220 and penetrates through the second housing 210. The fourth set of contacts 244 may include one contact or multiple contacts. In case that the fourth set of contacts 244 includes only one contact, the contact is installed on the second coupler socket 220, and then one through hole is defined on the second housing 210 at a position corresponding to the contact, so that the contact 244 installed on the second coupler socket 220 penetrates through the second housing 210 through the through hole. In case that the fourth set of contacts 244 includes multiple contacts, each contact in the fourth set of contacts 244 is installed on the second coupler socket 220, and then multiple through holes may be defined on the second housing 210 at positions corresponding to the multiple contacts, respectively, so that each contact of the fourth set of contacts 244 installed on the second coupler socket 220 penetrates through the second housing 210 through the corresponding through hole of the second housing 210. Generally, the fourth set of contacts 244 includes two contacts, and each contact in the fourth set of contacts 244 is made of metal material, so that each contact can conduct electricity. In some specific embodiments, each contact in the fourth set of contacts 244 is an elastic contact pin such as a Pogo pin.

The controller MCU2 and the second communication circuit 260 are both located in the inner cavity of the second housing 210, and the controller MCU2 may be a single-chip microcomputer. The second communication circuit 260 has a first end and a second end. The first end of the second communication circuit 260 may be electrically connected to the controller MCU2, and the second end of the second communication circuit 260 may be electrically connected to the fourth set of contacts 244. In this way, the electrical signal output by the controller MCU2 can be output to the fourth set of contacts 244 through the second communication circuit 260, and the electrical signal of the fourth set of contacts 244 can also be input to the controller MCU2 through the second communication circuit 260.

In the embodiment of the present application, an electrical connection is formed between the fourth set of contacts 244 and the third set of contacts 144 when the second coupler socket 220 is in a snap connection with the first coupler socket 120. In this way, the first device 10 and the second device 20 are connected when a snap connection is formed between the second coupler socket 220 and the first coupler socket 120. Meanwhile, the voltage from the first voltage terminal V1 can be output, through the power supply circuit 130, the first set of contacts 142, the second set of contacts 242 and the power receiving circuit 230, to the controller MCU2 of the second device 20 so as to supply power to the controller MCU2 of the second device 20. The controller MCU1 may be electrically connected to the controller MCU2 through the first communication circuit 160, the third set of contacts 144, the fourth set of contacts 244 and the second communication circuit 260, thereby achieving a bidirectional communication between the controller MCU1 and the controller MCU2. In some specific embodiments, as shown in FIG. 10, the first device 10 also includes a physical field sensor 150, and the second device 20 also includes a field component 250. The controller MCU1 may output an electrical signal to the first communication circuit 160 when and only when an on-signal is output by the physical field sensor 150 to the controller MCU1.

The specific implementations of the first communication circuit 160 and the second communication circuit 260 will be explained in detail below with reference to the drawings.

Figure 11:
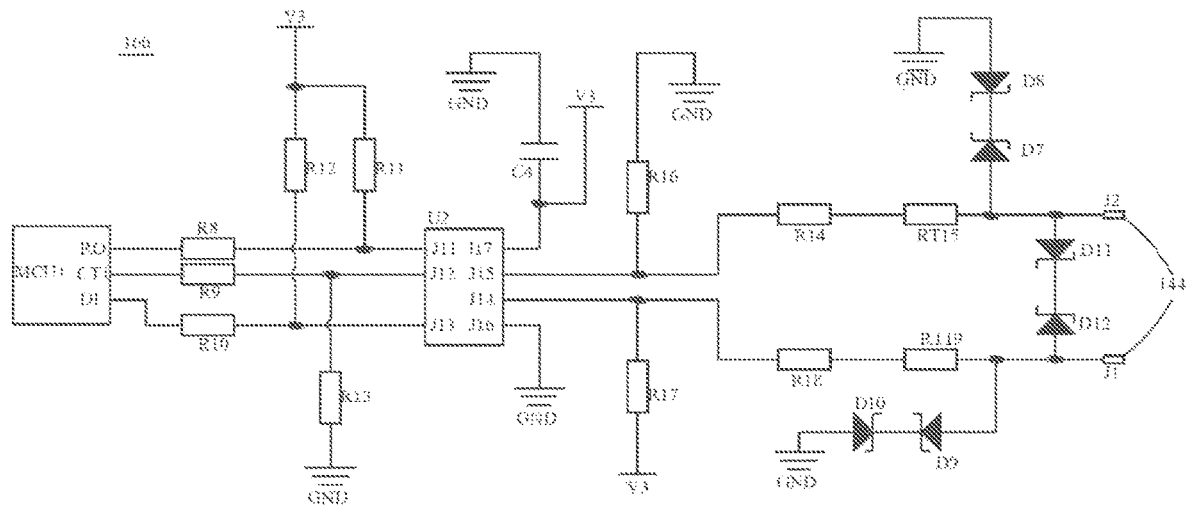
FIG. 11 is a circuit structure diagram of a first communication circuit in accordance with an embodiment of the present application.

FIG. 11 is a circuit structure diagram of a first communication circuit 160 in accordance with an embodiment of the present application. As shown in FIG. 11, in some embodiments, the first communication circuit 160 includes a communication chip U2.

The communication chip U2 includes a first pin J11, a second pin J12, a third pin J13, a fourth pin J14 and a fifth pin J15. The first pin J11 of the communication chip U2 is electrically connected to a communication output end RO of the controller MCU1. The second pin J12 of the communication chip U2 is electrically connected to a communication control end CT1 of the controller MCU1. The third pin J13 of the communication chip U2 is electrically connected to a communication input end DI of the controller MCU1. The fourth pin J14 of the communication chip U2 is electrically connected to a contact J1 in the third set of contacts 144. The fifth pin J15 of the communication chip U2 is electrically connected to a contact J2 in the third set of contacts 144.

Figure 12:
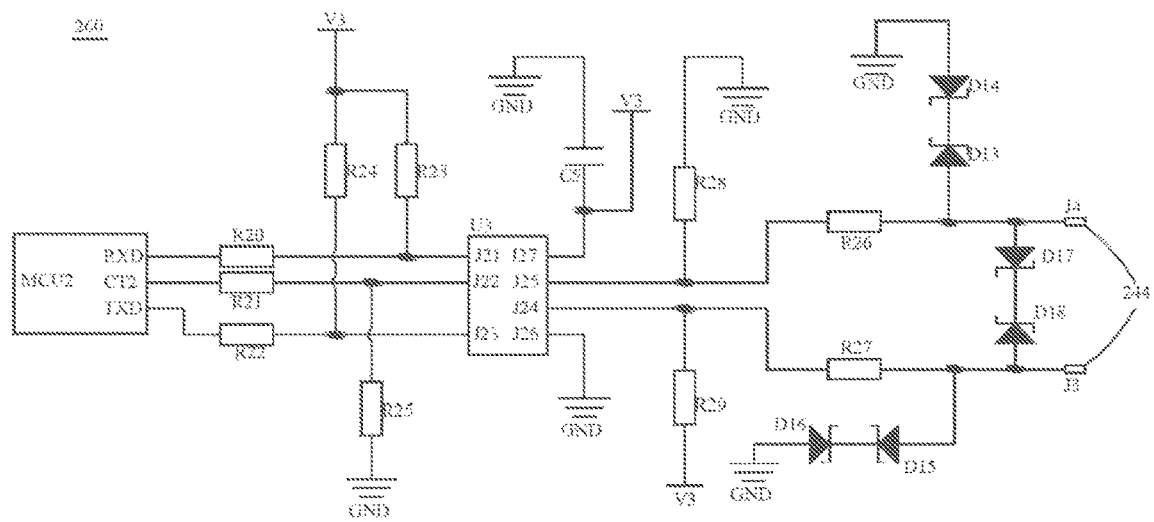
FIG. 12 is a circuit structure diagram of a second communication circuit in accordance with an embodiment of the present application.

FIG. 12 is a circuit structure diagram of a second communication circuit 260 in accordance with an embodiment of the present application. As shown in FIG. 12, in some embodiments, the second communication circuit 260 includes a communication chip U3.

The communication chip U3 includes a first pin J21, a second pin J22, a third pin J23, a fourth pin J24 and a fifth pin J25. The first pin J21 of the communication chip U3 is electrically connected to a communication output end RXD of the controller MCU2. The second pin J22 of the communication chip U3 is electrically connected to a communication control end CT2 of the controller MCU2. The third pin of the communication chip U3 J23 is electrically connected to a communication input end TXD of the controller MCU2. The fourth pin J24 of the communication chip U3 is electrically connected to a contact J3 in the fourth set of contacts 244. The fifth pin J25 of the communication chip U3 is electrically connected to a contact J4 in the fourth set of contacts 244.

The contact J3 is electrically connected to the contact J1, and the contact J4 is electrically connected to the contact J2, when a snap connection is formed between the second coupler socket 220 and the first coupler socket 120.

In some specific embodiments, both the communication chip U2 and the communication chip U3 may be the chip MAX14783. In this circumstance, both the first pin J11 of the communication chip U2 and the first pin J21 of the communication chip U3 may both be the RO pin of the chip MAX14783. Both the second pin J12 of the communication chip U2 and the second pin J22 of the communication chip U3 may be the RE-pin or the DE pin of the chip MAX14783. Both the third pin J13 of the communication chip U2 and the third pin J23 of the communication chip U3 may be the DI pin of the chip MAX14783. Both the fourth pin J14 of the communication chip U2 and the fourth pin J24 of the communication chip U3 may be the A pin of the chip MAX14783. Both the fifth pin J15 of the communication chip U2 and the fifth pin J25 of the communication chip U3 may be the B pin of the chip MAX14783. That is to say, both the fourth pin J14 and the fifth pin J15 of the communication chip U2 may be used to output or input differential signals, and both the fourth pin J24 and the fifth pin J25 of the communication chip U3 may also be used to input or output differential signals. The controller MCU1 and the controller MCU2 are in communication through differential signals between the communication chip U2 and the communication chip U3.

As shown in FIG. 11, in some specific embodiments, the communication chip U2 also includes a sixth pin J16 and a seventh pin J17. The sixth pin J16 of the communication chip U2 is the ground pin for being electrically connected to the ground wire GND. The seventh pin J17 of the communication chip U2 is the power-supply pin for being electrically connected to the third voltage terminal V3. The first communication circuit 160 also includes a resistor R8, a resistor R9, a resistor R10, a resistor R11, a resistor R12, a resistor R13, a resistor R14, a resistor R16, a resistor R17, a resistor R18, a capacitor C4, a thermistor RT15, a thermistor RT19, a Zener diode D7, a Zener diode D8, a Zener diode D9, a Zener diode D10, a Zener diode D11 and a Zener diode D12. The resistor R8 is electrically connected between the communication output end RO of the controller MCU1 and the first pin J11 of the communication chip U2. The resistor R9 is electrically connected between the second pin J12 of the communication chip U2 and the communication control end CT1 of the controller MCU1. The resistor R10 is electrically connected between the third pin J13 of the communication chip U2 and the communication input end DI of the controller MCU1. The resistor R11 is electrically connected between the third voltage terminal V3 and the first pin J11 of the communication chip U2. The resistor R12 is electrically connected between the third voltage terminal V3 and the third pin J13 of the communication chip U2. The resistor R13 is electrically connected between the second pin J12 of the communication chip U2 and the ground wire GND. The capacitor C4 is electrically connected between the seventh pin J17 of the communication chip U2 and the ground wire GND. The resistor R16 is electrically connected between the fifth pin J15 of the communication chip U2 and the ground wire GND. The resistor R17 is electrically connected between the fourth pin J14 of the communication chip U2 and the third voltage terminal V3. The resistor R14 and the thermistor RT15 are electrically connected between the fifth pin J15 of the communication chip U2 and the contact J2 in the third set of contacts 144 after being connected in series. The resistor R18 and the thermistor RT19 are electrically connected between the fourth pin J14 of the communication chip U2 and the contact J1 in the third set of contacts 144 after being connected in series. The cathode of the Zener diode D7 is electrically connected to the cathode of the Zener diode D8. The anode of the Zener diode D7 is electrically connected to the contact J2 in the third set of contacts 144. The anode of the Zener diode D8 is electrically connected to the ground wire GND. The cathode of the Zener diode D9 is electrically connected to the cathode of the Zener diode D10. The anode of the Zener diode D9 is electrically connected to the contact J1 in the third set of contacts 144. The anode of the Zener diode D10 is electrically connected to the ground wire GND. The cathode of the Zener diode D11 is electrically connected to the cathode of the Zener diode D12. The anode of the Zener diode D11 is electrically connected to the contact J2 in the third set of contacts 144. The anode of the Zener diode D12 is electrically connected to the contact J1 in the third set of contacts 144.

As shown in FIG. 12, in some specific embodiments, the communication chip U3 also includes a sixth pin J26 and a seventh pin J27. The sixth pin J26 of the communication chip U3 is the ground pin for being electrically connected to the ground wire GND. The seventh pin J27 of the communication chip U3 is the power-supply pin for being electrically connected to the third voltage terminal V3. The first communication circuit 160 also includes: a resistor R20, a resistor R21, a resistor R22, a resistor R23, a resistor R24, a resistor R25, a resistor R26, a resistor R27, a resistor R28, a resistor R29, a capacitor C5, a Zener diode D13, a Zener diode D14, a Zener diode D15, a Zener diode D16, a Zener diode D17 and a Zener diode D18. The resistor R20 is electrically connected between the communication output end RXD of the controller MCU2 and the first pin J21 of the communication chip U3. The resistor R21 is electrically connected between the second pin J22 of the communication chip U3 and the communication control end CT2 of the controller MCU2. The resistor R22 is electrically connected between the third pin J23 of the communication chip U3 and the communication input end TXD of the controller MCU2. The resistor R23 is electrically connected between the third voltage terminal V3 and the first pin J21 of the communication chip U3. The resistor R24 is electrically connected between the third voltage terminal V3 and the third pin J23 of the communication chip U3. The resistor R25 is electrically connected between the second pin J22 of the communication chip U3 and the ground wire GND. The capacitor C5 is electrically connected between the seventh pin J27 of the communication chip U3 and the ground wire GND. The resistor R28 is electrically connected between the fifth pin J25 of the communication chip U3 and the ground wire GND. The resistor R29 is electrically connected between the fourth pin J24 of the communication chip U3 and the third voltage terminal V3. The resistor R26 is electrically connected between the fifth pin J25 of the communication chip U3 and the contact J4 in the fourth set of contacts 244. The resistor R27 is electrically connected between the fourth pin J24 of the communication chip U3 and the contact J3 in the fourth set of contacts 244. The cathode of the Zener diode D13 is electrically connected to the cathode of the Zener diode D14. The anode of the Zener diode D13 is electrically connected to the contact J4 in the fourth set of contacts 244, The anode of the Zener diode D13 is electrically connected to the ground wire GND. The cathode of the Zener diode D15 is electrically connected to the cathode of the Zener diode D16. The anode of the Zener diode D15 is electrically connected to the contact J3 in the fourth set of contacts 244. The anode of the Zener diode D16 is electrically connected to the ground wire GND. The cathode of the Zener diode D17 is electrically connected to the cathode of the Zener diode D18. The anode of the Zener diode D17 is electrically connected to the contact J4 in the fourth set of contacts 244. The anode of the Zener diode D18 is electrically connected to the contact J3 in the fourth set of contacts 244.

In still other embodiments, as shown in FIG. 2, FIG. 3 and FIG. 10, the first device 10 also includes a first connector 172. The first connector 172 is installed on the first housing 110 and penetrates through the first housing 110, and a first end of the first connector 172 is electrically connected to the controller MCU1. The second device 20 also includes a second connector 272. The second connector 272 is installed on the second housing 210 and penetrates through the second housing 210, and a first end of the second connector 272 is electrically connected to the controller MCU2. The second end of the second connector 272 may be electrically connected to the second end of the first connector 172 through a first cable. The first connector 172 and the second connector 272 here may be sockets for cables to be inserted. In a case that the first device 10 and the second device 20 cannot be snap-connected through the first coupler socket 120 and the second coupler socket 220, the first device 10 and the second device 20 can also communicate with each other through the first connector 172, the second connector 272 and the first cable, thereby enriching the application scenarios of the power supply system 01.

Meanwhile, the first device 10 also includes a third connector 174. The third connector 174 is installed on the first housing 110 and penetrates the first housing 110, and a first end of the third connector 174 may be electrically connected to the first voltage terminal V1. The second device 20 also includes a fourth connector 274. The fourth connector 274 is installed on the second housing 210 and penetrates through the second housing 210, and a first end of the fourth connector 274 may be electrically connected to other devices (such as the controller MCU2) that require power in the second device 20. A second end of the fourth connector 274 may be electrically connected to the second end of the third connector 174 through a second cable. The third connector 174 and the fourth connector 274 here may be sockets for cables to be inserted. In a case that the first device 10 and the second device 20 cannot be snap-connected through the first coupler socket 120 and the second coupler socket 220, the electrical power can also be transmitted between the first device 10 and the second device 20 through the third connector 174, the fourth connector 274 and the second cable, thereby enriching the application scenarios of the power supply system 01.

In the embodiments of the present application, the power supply system 01 includes a first device 10 and a second device 20. The first device 10 may be one of a control device and a film-and-television light, and the second device 20 may be the other of a control device and a film-and-television light. The first device 10 includes a first housing 110, a first coupler socket 120 located on the surface of the first housing 110, a power supply circuit 130 located in the first housing 110, and a first set of contacts 142. The first set of contacts 142 is installed on the first coupler socket 120, penetrates through the first housing 110 and is electrically connected to an output end of the power supply circuit 130. The second device 20 includes a second housing 210, a second coupler socket 220 located on the surface of the second housing 210, a power receiving circuit 230 located in the second housing 210, and a second set of contacts 242. The second set of contacts 242 is installed on the second coupler socket 220, penetrates through the second housing 210 and is electrically connected to an input end of the power receiving circuit 230. The first device 10 can be the second device 20 can be electrically connected when a snap connection is formed between the first coupler socket 120 and the second coupler socket 220. At this time, the second set of contacts 242 is in contact with the first set of contacts 142, and is electrically connected, so that the output end of the power supply circuit 130 is electrically connected to the input end of the power receiving circuit 230. In the power supply system 01, the first device 10 and the second device 20 can be snap-connected through the first coupler socket 120 and the second coupler socket 220, and the power supply circuit 130 in the first device 10 and the power receiving circuit 230 in the second device 20 can be electrically connected through the first set of contacts 142 installed on the first coupler socket 120 and the second set of contacts 242 installed on the second coupler socket 220. Thus, the connection manner between the first device 10 and the second device 20 can be simplified.

The second device 20 may also include a field component 250 and the first device 10 may also include a physical field sensor 150. When and only when a snap connection is formed between the first coupler socket 120 and the second coupler socket 220, the on-signal is output from the physical field sensor 150 to enable a conduction between the input end and the output end of the power supply circuit 130, and then the output end of the power supply circuit 130 will have a voltage. In this circumstance, the output end of the power supply circuit 130 can be prevented from having a voltage when the first coupler socket 120 of the first device 10 and the second coupler socket 220 of the second device 20 are disconnected, thereby preventing electric shock if the first set of contacts 142 is touched by the human body, and then improving the safety of the power supply system 01. At the same time, the risk of damage to the first device 10 caused by the exposure of the first set of contacts 142 can also be reduced. The first device 10 may also include a controller MCU1, a first communication circuit 160 and a third set of contacts 144. The second device 20 may also include a controller MCU2, a second communication circuit 260 and a fourth set of contacts 244. In this circumstance, the controller MCU1 and the controller MCU2 can communicate with each other through the first communication circuit 160, the third set of contacts 144, the second communication circuit 260 and the fourth set of contacts 244. The first device 10 may also include a first connector 172 and a third connector 174, and the second device 20 may also include a second connector 272 and a fourth connector 274. The first connector 172 may be electrically connected to the second connector 272 through a first cable, and the third connector 174 may be electrically connected to the fourth connector 274 through a second cable. As such, the first device 10 and the second device 20 can also communicate with each other through the first connector 172, the second connector 272 and the first cable and perform electric power transmission through the third connector 174, the fourth connector 274 and the second cable power, so that the application scenarios of the power supply system 01 are more abundant.

The above-mentioned embodiments are only used to illustrate rather than limit the schemes of the present application. Although this disclosure has been described in detail with reference to the above-mentioned embodiments, it should be understood for those of ordinary skill in the art that the schemes in the above-mentioned embodiments may be modified, or some features in the schemes may be equivalently replaced. These modifications or replacements do not make the essence of the corresponding schemes deviate from the spirit and scope of the schemes in the embodiments of the present application, and thus should all be included within the protection scope of the present application.

What is claimed is:

1. A power supply system, comprising:
    a first device, comprising:
        a first housing;
        a first coupler socket, located on an outer surface of the first housing;
        a power supply circuit, located in an inner cavity of the first housing, an input end of the power supply circuit being electrically connected to a first voltage terminal; and
        a first set of contacts, installed on the first coupler socket, penetrating through the first housing, and electrically connected to an output end of the power supply circuit; and
    a second device, comprising:
        a second housing;
        a second coupler socket, located on an outer surface of the second housing;
        a power receiving circuit, located in an inner cavity of the second housing; and
        a second set of contacts, installed on the second coupler socket, penetrating through the second housing, and electrically connected to an input end of the power receiving circuit;
    wherein the second coupler socket is configured to form a snap connection with the first coupler socket, and the second set of contacts is in electrical connection with the first set of contacts when the snap connection is formed between the second coupler socket and the first coupler socket, and
    the first device further comprising:
        a first controller, located in the inner cavity of the first housing;
        a first communication circuit, located in the inner cavity of the first housing, and a first end of the first communication circuit being electrically connected to the first controller; and
        a third set of contacts, installed on the first coupler socket, penetrating through the first housing, and electrically connected to a second end of the first communication circuit; and
    the second device further comprising:
        a second controller, located in the inner cavity of the second housing;
        a second communication circuit, located in the inner cavity of the second housing, and a first end of the second communication circuit being electrically connected to the second controller; and
        a fourth set of contacts, installed on the second coupler socket, penetrating through the second housing, and electrically connected to a second end of the second communication circuit; and
    wherein the fourth set of contacts is in electrical connection with the third set of contacts when the snap connection is formed between the second coupler socket and the first coupler socket.

2. The power supply system according to claim 1, wherein the second device comprises a field component configured for generating a physical field, and the field component is connected to the second housing;
    the first device further comprises a physical field sensor, the physical field sensor is connected to the first housing, and the physical field sensor is configured to sense the physical field generated by the field component, and to output an on-signal under an action of the physical field generated by the component when the snap connection is formed between the second coupler socket and the first coupler socket; and
    a control end of the power supply circuit is electrically connected to an output end of the physical field sensor, to enable a conduction between the input end and the output end of the power supply circuit when the on-signal is output from the physical field sensor.

3. The power supply system according to claim 2, wherein the field component comprises a magnet, and the physical field sensor comprises a Hall sensor or a reed switch; or
    the field component comprises an energized conductor, and the physical field sensor comprises an electric field sensor.

4. The power supply system according to claim 3, wherein the Hall sensor comprises: a Hall sensor chip, a first resistor, a second resistor and a first capacitor;
    a power-supply pin of the Hall sensor chip is configured to be electrically connected to a second voltage terminal, a ground pin of the Hall sensor chip is configured to be electrically connected to a ground wire, and a voltage from the second voltage terminal is greater than a voltage of the ground wire;
    a first end of the first resistor is electrically connected to an output pin of the Hall sensor chip;
    a second end of the first resistor is electrically connected to a first end of the second resistor and the control end of the power supply circuit;
    a second end of the second resistor is configured to be electrically connected to the ground wire;
    a first electrode plate of the first capacitor is electrically connected to the second end of the first resistor; and
    a second electrode plate of the first capacitor is configured to be electrically connected to the ground wire.

5. The power supply system according to claim 4, the second voltage terminal is an output end of a second voltage-conversion circuit, and an input end of the second voltage-conversion circuit is electrically connected to mains or other external power sources, or the first voltage terminal, and wherein the second voltage-conversion circuit is configured to convert a voltage output from the mains or other external power sources, or the first voltage terminal into a DC voltage of 5V, and output the DC voltage of 5V.

6. The power supply system according to claim 4, wherein the reed switch comprises: a third resistor and a first magnetic sensitive switch;
    a first end of the third resistor is configured to be electrically connected to a third voltage terminal;
    a second end of the third resistor is electrically connected to a first end of the first magnetic sensitive switch and the control end of the power supply circuit; and
    a second end of the first magnetic sensitive switch is configured to be electrically connected to a ground wire, and a voltage from the third voltage terminal is greater than a voltage of the ground wire.

7. The power supply system according to claim 6, the third voltage terminal is an output end of a third voltage-conversion circuit, and an input end of the third voltage-conversion circuit is electrically connected to mains, other external power sources, the first voltage terminal or the second voltage terminal, wherein the third voltage-conversion circuit is configured to convert the voltage output from the mains, the other external power sources, the first voltage terminal or the second voltage terminal into a DC voltage of 3.3V and output the DC voltage of 3.3V.

8. The power supply system according to claim 3, wherein the reed switch comprises: a third resistor and a first magnetic sensitive switch;
- a first end of the third resistor is configured to be electrically connected to a third voltage terminal;
- a second end of the third resistor is electrically connected to a first end of the first magnetic sensitive switch and the control end of the power supply circuit; and
- a second end of the first magnetic sensitive switch is configured to be electrically connected to a ground wire, and a voltage from the third voltage terminal is greater than a voltage of the ground wire.

9. The power supply system according to claim 2, wherein the power supply circuit comprises: a first transistor and a second transistor;
- a control electrode of the first transistor is electrically connected to the output end of the physical field sensor;
- a first electrode of the first transistor is electrically connected to a control electrode of the second transistor;
- a second electrode of the first transistor is electrically connected a ground wire;
- a first electrode of the second transistor is configured to be electrically connected to the first voltage terminal; and
- a second electrode of the second transistor is electrically connected to the first set of contacts.

10. The power supply system according to claim 1, wherein the first communication circuit comprises a first communication chip,
- a first pin of the first communication chip is electrically connected to a communication output end of the first controller,
- a second pin of the first communication chip is electrically connected to a communication control end of the first controller,
- a third pin of the first communication chip is electrically connected to a communication input end of the first controller,
- a fourth pin of the first communication chip is electrically connected to a first contact in the third set of contacts, and
- a fifth pin of the first communication chip is electrically connected to a second contact of the third set of contacts; and
- wherein the second communication circuit comprises a second communication chip,
- a first pin of the second communication chip is electrically connected to a communication output end of the second controller,
- a second pin of the second communication chip is electrically connected to a communication control end of the second controller,
- a third pin of the second communication chip is electrically connected to a communication input end of the second controller,
- a fourth pin of the second communication chip is electrically connected to a third contact in the fourth set of contacts, and
- a fifth pin of the second communication chip is electrically connected to a fourth contact in the fourth set of contacts; and
- wherein the third contact is in electrical connection with the first contact, and the fourth contact is in electrical connection with the second contact, when the snap connection is formed between the second coupler socket and the first coupler socket.

11. The power supply system according to claim 1, wherein the first device further comprises a first connector, the first connector is installed on the first housing and penetrates through the first housing, wherein a first end of the first connector is electrically connected to the first controller;
- the second device further comprises a second connector, the second connector is installed on the second housing and penetrates through the second housing, wherein a first end of the second connector is electrically connected to the second controller; and
- a second end of the second connector is configured to be electrically connected with a second end of the first connector through a first cable.

12. The power supply system according to claim 1, the first voltage terminal is an output end of a first voltage-conversion circuit, and an input end of the first voltage-conversion circuit is electrically connected to mains or other external power sources, and wherein the first voltage-conversion circuit is configured to convert a voltage output from the mains or other external power sources into a DC voltage of 18V and output the DC voltage of 18V.

13. A power supply system, comprising:
- a first device, comprising:
  - a first housing;
  - a first coupler socket, located on an outer surface of the first housing;
  - a power supply circuit, located in an inner cavity of the first housing, an input end of the power supply circuit being electrically connected to a first voltage terminal; and
  - a first set of contacts, installed on the first coupler socket, penetrating through the first housing, and electrically connected to an output end of the power supply circuit; and
- a second device, comprising:
  - a second housing;
  - a second coupler socket, located on an outer surface of the second housing;
  - a power receiving circuit, located in an inner cavity of the second housing; and
  - a second set of contacts, installed on the second coupler socket, penetrating through the second housing, and electrically connected to an input end of the power receiving circuit;
- wherein the second coupler socket is configured to form a snap connection with the first coupler socket, and the second set of contacts is in electrical connection with the first set of contacts when the snap connection is formed between the second coupler socket and the first coupler socket,
- wherein the power receiving circuit comprises: a fourth resistor, a diode and a Zener diode; a first end of the fourth resistor is electrically connected to the second set of contacts; a second end of the fourth resistor is electrically connected to an anode of the diode; a cathode of the diode is configured to output electrical energy; an anode of the Zener diode is electrically connected to a ground wire; and a cathode of the Zener diode is electrically connected to the cathode of the diode.

14. A power supply system, comprising:
a first device, comprising:
   a first housing;
   a first coupler socket, located on an outer surface of the first housing;
   a power supply circuit, located in an inner cavity of the first housing, an input end of the power supply circuit being electrically connected to a first voltage terminal; and
   a first set of contacts, installed on the first coupler socket, penetrating through the first housing, and electrically connected to an output end of the power supply circuit; and
a second device, comprising:
   a second housing;
   a second coupler socket, located on an outer surface of the second housing;
   a power receiving circuit, located in an inner cavity of the second housing; and
   a second set of contacts, installed on the second coupler socket, penetrating through the second housing, and electrically connected to an input end of the power receiving circuit;
wherein the second coupler socket is configured to form a snap connection with the first coupler socket, and the second set of contacts is in electrical connection with the first set of contacts when the snap connection is formed between the second coupler socket and the first coupler socket,
wherein the first device further comprises a third connector, the third connector is installed on the first housing and penetrates through the first housing, wherein a first end of the third connector is configured to be electrically connected to the first voltage terminal; and
the second device further comprises a fourth connector, the fourth connector is installed on the second housing and penetrates through the second housing, wherein a second end of the fourth connector is configured to be electrically connected to a second end of the third connector through a second cable.

15. The power supply system according to claim 14, wherein the second device comprises a field component configured for generating a physical field, and the field component is connected to the second housing;
   the first device further comprises a physical field sensor, the physical field sensor is connected to the first housing, and the physical field sensor is configured to sense the physical field generated by the field component, and to output an on-signal under an action of the physical field generated by the component when the snap connection is formed between the second coupler socket and the first coupler socket; and
   a control end of the power supply circuit is electrically connected to an output end of the physical field sensor, to enable a conduction between the input end and the output end of the power supply circuit when the on-signal is output from the physical field sensor.

16. The power supply system according to claim 15, wherein the field component comprises a magnet, and the physical field sensor comprises a Hall sensor or a reed switch; or
   the field component comprises an energized conductor, and the physical field sensor comprises an electric field sensor.

17. The power supply system according to claim 16, wherein the Hall sensor comprises: a Hall sensor chip, a first resistor, a second resistor and a first capacitor;
   a power-supply pin of the Hall sensor chip is configured to be electrically connected to a second voltage terminal, a ground pin of the Hall sensor chip is configured to be electrically connected to a ground wire, and a voltage from the second voltage terminal is greater than a voltage of the ground wire;
   a first end of the first resistor is electrically connected to an output pin of the Hall sensor chip;
   a second end of the first resistor is electrically connected to a first end of the second resistor and the control end of the power supply circuit;
   a second end of the second resistor is configured to be electrically connected to the ground wire;
   a first electrode plate of the first capacitor is electrically connected to the second end of the first resistor; and
   a second electrode plate of the first capacitor is configured to be electrically connected to the ground wire.

18. The power supply system according to claim 16, wherein the reed switch comprises: a third resistor and a first magnetic sensitive switch;
   a first end of the third resistor is configured to be electrically connected to a third voltage terminal;
   a second end of the third resistor is electrically connected to a first end of the first magnetic sensitive switch and the control end of the power supply circuit; and
   a second end of the first magnetic sensitive switch is configured to be electrically connected to a ground wire, and a voltage from the third voltage terminal is greater than a voltage of the ground wire.

19. The power supply system according to claim 15, wherein the power supply circuit comprises: a first transistor and a second transistor;
   a control electrode of the first transistor is electrically connected to the output end of the physical field sensor;
   a first electrode of the first transistor is electrically connected to a control electrode of the second transistor;
   a second electrode of the first transistor is electrically connected a ground wire;
   a first electrode of the second transistor is configured to be electrically connected to the first voltage terminal; and
   a second electrode of the second transistor is electrically connected to the first set of contacts.

* * * * *